United States Patent
Hofmann et al.

(10) Patent No.: US 7,611,928 B2
(45) Date of Patent: Nov. 3, 2009

(54) METHOD FOR PRODUCING A SUBSTRATE

(75) Inventors: Franz Hofmann, Munich (DE);
Richard Johannes Luyken, Munich (DE); Wolfgang Roesner, Ottobrunn (DE); Michael Specht, Munich (DE); Martin Stadele, Ottobrunn (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/968,846

(22) Filed: Oct. 18, 2004

(65) Prior Publication Data

US 2005/0110088 A1 May 26, 2005

Related U.S. Application Data

(63) Continuation of application No. PCT/DE03/01281, filed on Apr. 16, 2003.

(30) Foreign Application Priority Data

Apr. 16, 2002 (DE) ................ 102 16 838
May 22, 2002 (DE) ................ 102 22 679

(51) Int. Cl.
*H01L 21/00* (2006.01)
(52) U.S. Cl. ................ 438/149; 438/153; 438/154; 438/164; 438/406; 438/469; 438/761; 438/762; 438/763; 438/479
(58) Field of Classification Search ................ 438/149, 438/153–154, 164, 406, 469, 517, 761–763, 438/478–479; 257/347, 349
See application file for complete search history.

(56) References Cited

U.S. PATENT DOCUMENTS

| 4,399,605 | A | * | 8/1983 | Dash et al. | ................ 438/154 |
| 5,070,034 | A | | 12/1991 | Satoh et al. | |
| 5,234,535 | A | | 8/1993 | Beyer et al. | |
| 5,279,978 | A | | 1/1994 | See et al. | |
| 5,534,459 | A | * | 7/1996 | Kim | ................ 438/479 |
| 6,329,689 | B1 | | 12/2001 | Manning | |

(Continued)

FOREIGN PATENT DOCUMENTS

EP 0 810 652 A2 12/1997

(Continued)

OTHER PUBLICATIONS

B. Eitan et al.; "NROM: A Novel Localized Trapping, 2-Bit Non-volatile Memory Cell"; IEEE Electron Device Letters, vol. 21, No. 11, Nov. 2000, pp. 543-545.

(Continued)

*Primary Examiner*—Samuel A Gebremariam
(74) *Attorney, Agent, or Firm*—Dickstein, Shapiro, LLP.

(57) ABSTRACT

Substrate having a first partial substrate with a carrier layer and a second partial substrate, which is bonded to the first partial substrate. The second partial substrate has an insulator layer, which is applied on the carrier layer and has at least two regions each having a different thickness, thereby forming a stepped surface of the insulator layer, and a semiconductor layer, which is applied to the stepped surface of the insulator layer and is formed at least partially epitaxially, wherein the semiconductor layer has a planar surface which is opposite to the stepped surface of the insulator layer. Transistors are formed on the semiconductor layer.

8 Claims, 8 Drawing Sheets

U.S. PATENT DOCUMENTS 6,492,209 B1 * 12/2002 Krishnan et al. ............ 438/149
6,514,809 B1 * 2/2003 Xiang ........................ 438/214
6,712,288 B2 3/2004 Yanagita et al.

FOREIGN PATENT DOCUMENTS

| | | |
|---|---|---|
| JP | 3-211876 A | 9/1991 |
| JP | 4-323851 A | 11/1991 |
| JP | 6-104412 A | 4/1994 |
| JP | 6-163677 A | 6/1994 |
| JP | 6-252016 A | 9/1994 |
| JP | 2000-306993 A | 11/2000 |
| JP | 2000-349267 A | 12/2000 |
| JP | 2001-102442 A | 4/2001 |
| JP | 2001-320033 A | 11/2001 |
| JP | 2002-026137 A | 1/2002 |
| JP | 2002-075917 A | 3/2002 |

OTHER PUBLICATIONS

H. Hanafi et al.; "Fast and Long Retention-Time Nano-Crystal Memory"; IEEE Transactions on Electron Devices, vol. 43, No. 9, Sep. 1996, pp. 1553-1558.

D. Widmann et al.; "Technologie hochintegrierter Schaltungen" (Technology of Largescale Integrated Circuits), Chapter 8.4, Springer Verlag, Berlin, ISBN 3-540-59357-8(1996).

Homepage Firma Soitec (Feb. 12, 2002): http://www.soitec.com/unibont.htm.

* cited by examiner

METHOD FOR PRODUCING A SUBSTRATE

CROSS-REFERENCE TO RELATED APPLICATION

This application is a continuation of International Patent Application Serial No. PCT/DE03/01281, filed Apr. 16, 2003, which published in German on Oct. 23, 2003 as WO 03/088310, and is incorporated herein by reference in its entirety.

FIELD OF THE INVENTION

The invention relates to a substrate and a method for producing a substrate.

BACKGROUND OF THE INVENTION

Field-effect transistors are employed in many areas of electronics, in particular as switch elements or as storage elements of an integrated circuit.

New types of transistors are being developed and used particularly in the course of the ever increasing requirements made of mass storage devices.

In order to increase the storage density of a semiconductor memory, Eitan, B, Pavan, P, Bloom, I, Aloni, E, Frommer, A, Fiñzi, D (2000) "NROM: A Novel Localized Trapping, 2-Bit Nonvolatile Memory Cell" IEEE Electron Device Letters 21(11): 543-545, discloses using a so-called ONO field-effect transistor in order to store two bits of information therein. In the case of the field-effect transistor disclosed in Eitan et al., an ONO layer sequence having a silicon nitride layer between two silicon oxide layers is provided above the channel region between the two source/drain regions. The electrical transistor properties of the ONO field-effect transistor can be characteristically influenced by introducing charge carriers into the silicon nitride layer of the ONO layer sequence. A quantity of charge that codes the information to be stored is stored in the boundary regions between a respective one of the two source/drain regions and the ONO layer sequence using the tunnel effect. An item of stored information can be read out on account of the altered transistor properties (e.g. sign or intensity of the shift in the value of the threshold voltage).

Hanafi, H I, Tiwari, S, Khan, I (1996) "Fast and Long Retention-Time Nano-Crystal Memory" IEEE Transaction on Electron Devices 43(9): 1553-1558, discloses forming nanocrystals made of germanium or silicon in a gate-insulating layer of a field-effect transistor and permanently introducing electrical charge carriers into said nanocrystals using the tunnel effect. The transistor properties of the field-effect transistor are thereby characteristically influenced, whereby the information that is stored in the field-effect transistor and is coded by means of the quantity of charge introduced in the nanocrystals can be read out as altered transistor properties.

An important branch of silicon microelectronics is so-called SOI technology ("Silicon-on-Insulator"). The principles of SOI technology are described in Widmann, D, Mader, H, Friedrich, H (1996) "Technologie hochintegrierter Schaltungen" ["Technology of large scale integrated circuits"], Chapter 8.4, Springer Verlag, Berlin, IBSN 3-540-59357-8, for example. SOI technology requires an SOI substrate constructed from a layer stack of silicon/silicon oxide/silicon, in which case the two silicon layers that surround the silicon oxide layer on both sides should if possible be monocrystalline.

A central problem of conventional integrated circuits is the deterioration in the electrical properties of MOS transistors with increasing structural fineness on account of effects such as the punch-through effect and the latch-up effect. These problems are alleviated with the use of SOI technology.

However, technological problems exist on the one hand in producing an insulated monocrystalline layer on a silicon oxide layer and on the other hand in integrating this process step into an overall process in the production of an integrated circuit.

A method for producing an SOI layer sequence is described in Homepage of the company Soitec (Feb. 12, 2002): http://www.soitec.com/unibond.htm, for example. In accordance with the Smart-Cut™ method described therein, which was developed by the company Soitec, hydrogen ions are implanted into an oxidized silicon substrate and form a buried, mechanically weakened stripping layer. Using a wafer bonding method, the silicon oxide layer can be fixed on a further silicon substrate. An SOI layer sequence is thereby obtained. After a suitable heat treatment method step, the SOI layer sequence arranged above the stripping layer and comprising a thin silicon layer, a silicon oxide layer and the silicon substrate at the surface may be stripped from the carrier wafer.

An important aspect in the formation of a field-effect transistor of an integrated circuit is the setting of the threshold voltage of the transistor. In conventional transistor generations, this is carried out by setting the doping of the channel region and by setting the gate work function, that is to say by selecting the material for the gate region. Furthermore, it is possible to form so-called pocket regions, that is to say specifically doped regions in the channel region, in order to influence the threshold voltage of a conventional transistor.

However, for technological reasons, the material for the gate region may be predetermined or the free material selection may be restricted, so that the material selection as a parameter for setting the threshold voltage of a field-effect transistor may be obviated. Furthermore, in SOI technology, usually a very thin silicon layer is provided above the silicon oxide layer, so that clearly a sufficient volume does not remain for forming pocket regions in thin-film SOI technology. Therefore, this parameter for setting the threshold voltage is also obviated in SOI technology.

Furthermore, setting the threshold voltage by doping the channel region has the disadvantage that, on account of technologically unavoidable inhomogeneity fluctuations in the charge carrier density in the channel region of different field-effect transistors of a circuit, the threshold voltage may also be subjected to fluctuation in an undesirable manner. Furthermore, the doping of the channel region leads to an increase in the number of scattering centers for charge carriers and therefore results in an undesirable increase in the nonreactive resistance.

Therefore, in thin-film SOI technology which is of interest technologically, setting the work function of the gate material remains at most as a parameter for setting the threshold voltage. However, the free selection of a material of the gate region may be restricted for technological reasons.

It must be emphasized that in single-gate SOI transistors or double-gate SOI transistors, a channel doping is often dispensed with in order to achieve a low nonreactive resistance and therefore a high on current, and in order to avoid fluctuations in the threshold voltage on account of a fluctuation in the dopant concentration. However, this often has the consequence that a transistor in the off state blocks sufficiently reliably only when, in the case of an n-channel transistor, use is made of a gate material with a work function that is at least as high as, for instance, the so-called "midgap" work function, and when the channel region is preferably fully depleted of free charge carriers.

As MOS field-effect transistors are structurally refined to an increasing extent, their operation leads to the amplification of negative effects such as e.g. threshold voltage drop, the punch-through effect, the latch-up effect, and to the parasitic capacitances between source/drain regions and the substrate that increase more than proportionally in relation to the reciprocal transistor size. SOI technology (SOI=silicon on insulator) represents a solution to the problems described above. In accordance with this technology, each component is produced in a thin silicon island that is electrically insulated from its surroundings. The absence of a connection between the silicon islands means that a latch-up effect cannot occur. Furthermore, short-channel effects are alleviated since the active function of the transistors is restricted to a thin silicon film.

So-called thick-film SOI substrates have principally been used hitherto. These substrates have a relatively thick layer of silicon which, after it has been produced, is converted by means of doping into a region that is partially depleted of electrical charge carriers (PD region=partially depleted region). These PD-SOI substrates are used for example in analog devices, in photodiode arrays and fast bipolar integrated circuits (ICs).

Thin-film SOI substrates, which have a thin layer of silicon, which layer, after it has been produced, is converted by means of weak doping into a region that is fully depleted of electrical charge carriers (FD region=fully depleted region), are used only to a small extent at the present time. These FD-SOI transistors have a high speed and also a low current consumption.

Owing to their high speed and the low current consumption, a rising proportion of FD-SOI substrates is expected in the future. The rising proportion of FD-SOI substrates will be accompanied by a need for substrates which contain both thin-film SOI regions and thick-film SOI regions on a substrate (mixed substrates) in order to be able to utilize the advantages of PD regions and FD regions on a common substrate. The thickness of the silicon layer or the degree of depletion of electrical charge carriers determines the threshold voltage of the transistor. For fast logic elements, e.g. transistors having different threshold voltages are integrated in a circuit. By way of example, transistors having approximately 6 different threshold voltages are found in an embedded flash element.

The threshold voltage of transistors applied on an FD-SOI substrate can preferably be set by way of the work function of the gate material of the transistor. In the case of a transistor applied on a PD-SOI substrate, the threshold voltage can be defined by way of a channel implantation as in the case of a bulk transistor. In this connection, the term bulk transistor refers to a transistor in the case of which the transistor is constructed by means of doping in the lightly doped region of the respectively complementary doping. By way of example, a p-type substrate is used for the realization of an NMOS transistor, into which substrate the NMOS transistor is realized directly.

Such mixed substrates have been produced hitherto by thinning a PD-SOI substrate, at the locations which are intended to form an FD region, to a residual thickness provided for an FD-SOI substrate. The thinning can be achieved by means of a local silicon etching of the PD-SOI layer. A further method for producing an FD layer on a PD-SOI substrate is a local oxidation of the PD-SOI layer with subsequent removal of the silicon oxide formed.

Figure 1:
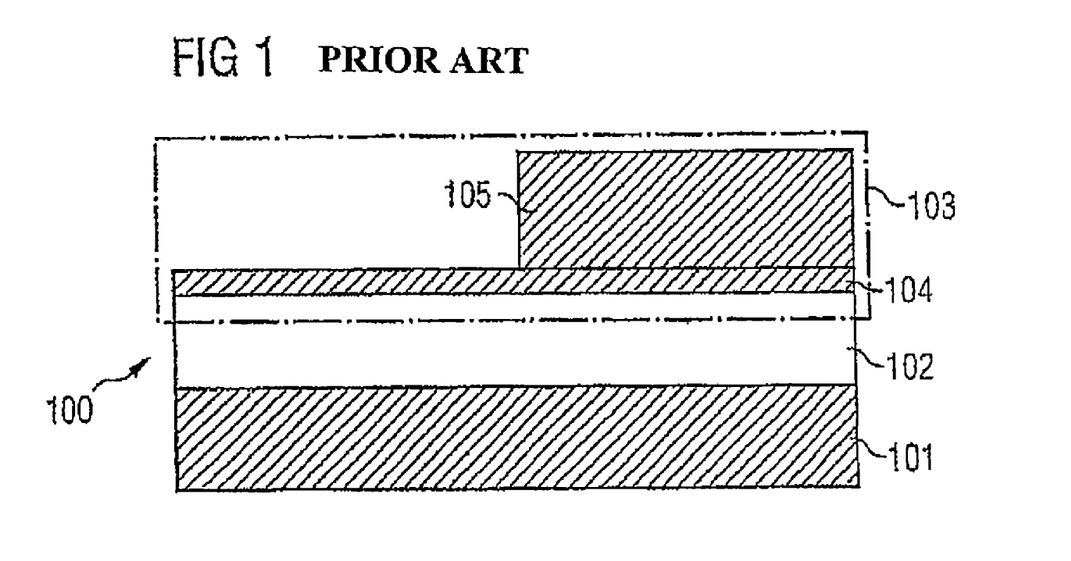
FIG. 1 shows a cross-sectional view of a substrate with semiconductor regions of two thicknesses in accordance with the prior art.

Furthermore, a mixed substrate can also be produced by a further silicon layer being formed onto an FD-SOI layer by means of selective epitaxy in a region of the FD-SOI layer, as a result of which a second region is formed in which the silicon layer has a larger thickness (PD-SOI region) than in the FD-SOI region. FIG. 1 illustrates a mixed substrate that has been produced in accordance with a method in accordance with the prior art.

FIG. 1 shows an SOI substrate 100 in accordance with the prior art, which has, on a silicon carrier substrate 101, a silicon oxide layer 102 and regions of a silicon semiconductor layer 103 which have different thicknesses. A first region 104 of the silicon semiconductor layer 103 has a smaller thickness of typically approximately 20 nm and is formed as a region that is fully depleted of charge carriers. A second region 105 of the silicon semiconductor layer 103 has a larger thickness of typically approximately 100 nm and is formed as a region that is partially depleted of charge carriers. Generally, the two regions 104, 105 of the semiconductor layer are formed by deposition of a thick silicon semiconductor layer which is subsequently etched back in the region that is later intended to be reformed into the first region 104 fully depleted of charge carriers. This method for producing a mixed substrate in accordance with the prior art gives rise to problems in the further processing of the mixed substrate as a result of the regions of different thickness 104 and 105.

The steps caused by the different thicknesses of the silicon layers constitute a problem in the case of a subsequent gate wiring across the boundaries of the different FD regions and PD regions.

A further problem is that, during the subsequent lithographic exposure of the surface, as a result of the limited focus depth of a stepper used for the exposure, problems can arise during the exposure across the boundaries present between in each case a PD region and an FD region.

Furthermore, the methods in which the semiconductor layer is etched back in regions or in which the semiconductor layer is oxidized exhibit the problem that it is difficult to exactly control the silicon thicknesses produced by means of the etching or oxidation.

JP 2000 306 993 A discloses the production of a multilayer substrate, in which a thin-film semiconductor active layer can be formed with a uniform thickness and the work effectiveness can be improved.

JP 06 110 4412 A discloses the production of a semiconductor device, in which simple formation steps are used in order to reduce production costs and in order to simplify the quality control.

SUMMARY OF THE INVENTION

The invention is based on the problem of providing a substrate in which the above-described disadvantages during wiring or during exposure of the substrate are avoided.

The problem is solved by means of a substrate, and also by means of a method for producing a substrate with the features in accordance with the independent patent claims. A substrate has a carrier layer. An insulator layer is situated on the carrier layer and has at least two regions each having a different thickness, thereby forming a stepped surface of the insulator layer. A semiconductor layer is situated on the stepped surface of the insulator layer, which semiconductor layer has a planar surface, the planar surface of the semiconductor layer being the surface which is opposite to the stepped surface of the insulator layer.

A method according to the invention for producing a substrate with regions of semiconductor layers which have different thicknesses has the following steps. An insulator layer is applied on a first carrier layer. The insulator layer has regions of different thicknesses, thereby forming a stepped surface of the insulator layer. As a further step, a semiconductor layer is applied on the stepped surface of the insulator layer, thereby forming a planar surface of the semiconductor layer, the area which is opposite to the stepped surface of the insulator layer being formed as the planar surface.

The substrate according to the invention has regions of a semiconductor in which the semiconductor regions have different thicknesses. The substrate simultaneously has a planar surface of the semiconductor layer. The above-described disadvantages of a mixed substrate in accordance with the prior art are avoided in particular on account of the planar surface of the semiconductor layer.

On account of the planar surface, the problems as in the case of a stepped surface of the substrate do not occur in the case of a wiring across region boundaries between regions having different thicknesses of semiconductor layers.

The planar surface of the substrate has the effect that the limited focus depth of a stepper used for the exposure no longer causes any problems during a lithographic exposure of the substrate over region boundaries between regions having different thicknesses of semiconductor layers.

Preferred refinements of the invention emerge from the dependent claims.

In accordance with a preferred embodiment, the semiconductor layer is formed from silicon and/or the insulator layer is formed from silicon oxide.

In a further embodiment, the regions of the semiconductor layer of two different thicknesses are formed as regions that are partially depleted of charge carriers and, respectively, are fully depleted of charge carriers.

In another embodiment, the substrate comprises two partial substrates that are coupled to one another by means of bonding.

A preferred exemplary embodiment of the method for producing a substrate according to the invention in this case has the following substeps. A substep for the formation of the semiconductor partial layer is a formation of a thin first semiconductor partial layer on an auxiliary carrier layer of a first partial substrate. The formation of the insulator layer has the substep of deposition of a protective layer, which serves as a masking layer, made of an insulator material in at least one region of the thin first semiconductor partial layer. The formation of the semiconductor layer furthermore has the substep of formation of a second semiconductor partial layer in the regions of the thin first semiconductor partial layer which are not covered by the masking layer made of the insulator material. The formation of the insulator layer furthermore has the substep of formation of a first insulator partial layer on the entire partial substrate surface. The surface of the first insulator partial layer is subsequently planarized. A further substep is the bonding of a second partial substrate, having a second insulator partial layer on a carrier layer, onto the planarized surface of the first insulator partial layer. The auxiliary carrier layer is then removed.

The first insulator partial layer is preferably planarized by means of chemical mechanical polishing.

In accordance with another embodiment, a layer made of porous silicon is produced on the auxiliary carrier layer before the application of the thin first semiconductor partial layer, which porous silicon is removed by means of a water jet for the purpose of removing the auxiliary carrier layer by means of etching.

In accordance with another embodiment, the method has the step of an $H_2$ heat treatment (hydrogen heat treatment) of the substrate after the removal of the auxiliary carrier layer.

Preferably, the carrier layer, the auxiliary carrier layer, the thin first semiconductor partial layer and the second semiconductor layer essentially comprise silicon and/or the first insulator partial layer, the second insulator partial layer and the protective layer essentially comprise silicon oxide.

Preferably, the thin first semiconductor partial layer and/or the second semiconductor partial layer are formed by means of epitaxy and/or selective epitaxy.

Preferably, regions that are partially depleted of charge carriers are produced by means of doping from the regions of a semiconductor layer which is formed from the thin first semiconductor partial layer and the second semiconductor partial layer, which regions have a larger thickness. Furthermore, a region which is fully depleted of charge carriers is produced by means of weak doping from the region of the semiconductor layer which has a smaller thickness.

By means of the exemplary embodiments set forth, a substrate is created which has regions of a semiconductor layer of differing thickness, the surface of the semiconductor layer being formed as a planar surface. This planar surface is obtained by means of simple process steps in the method according to the invention.

The thickness of the first semiconductor partial layer and of the second semiconductor partial layer can be set exactly as a result of the use of epitaxy for the application of the first semiconductor partial layer and the second semiconductor partial layer.

Since regions that are partially depleted of charge carriers (PD regions) and regions that are fully depleted of charge carriers (FD regions) are formed on a substrate by means of the method, different switching voltages of transistors can be realized in a simple and thus cost-effective manner, which transistors are formed on the substrate according to the invention. This facilitates e.g. the production of logic circuits that use transistors having different switching voltages.

An alternative aspect of the invention provides a field-effect transistor, a field-effect transistor arrangement, a method for adjusting an electrical transistor property of a field-effect transistor, and a method for producing a field-effect transistor, with the features described below.

This creates a possibility of being able to set the threshold voltage or another electrical transistor property of a field-effect transistor sufficiently accurately and with a reduced outlay in a flexible manner.

The field-effect transistor according to the invention has a charge storage layer below the channel region, which layer is arranged in such a way that an electrical transistor property of the field-effect transistor can be adjusted by introducing electrical charge carriers into the charge storage layer.

The field-effect transistor arrangement according to the invention has a plurality of field-effect transistors formed in and/or on a common substrate with the features mentioned above.

In accordance with the method according to the invention for adjusting an electrical transistor property of a field-effect transistor with a charge storage layer below the channel region, the electrical transistor property of the field-effect transistor is adjusted by introducing electrical charge carriers into the charge storage layer.

Furthermore, the invention provides a method for producing a field-effect transistor, in which a charge storage layer is arranged below the channel region in such a way that an electrical transistor property of the field-effect transistor can be adjusted by introducing electrical charge carriers into the charge storage layer.

A basic idea of the aspect of the invention described consists in providing a charge storage layer below the channel region, preferably in a manner protected from the surroundings by an electrically insulating (dielectric) layer on both sides, it being possible for the transistor properties, in particular the threshold voltage of the transistor, to be adjusted very precisely by introducing electrical charge carriers into the charge storage layer. As a result, if it is not possible to set the threshold voltage by selecting the channel doping or by selecting the material of the gate region, for example for technological reasons or in order to avoid a high-impedance channel region, a further possibility for setting the threshold voltage of a field-effect transistor is provided. The charge storage layer may be realized for example as an electrically conductive layer (e.g. doped polysilicon), as an ONO layer sequence or as a layer with nanocrystals below the channel region.

The aspect of the invention described has the advantage, in particular, of creating a possibility of setting the threshold voltage in particular in an undoped channel region of an SOI field-effect transistor. Furthermore, a fine adjustment is possible, which can be coordinated in particular with a predetermined gate work function, thereby enabling the use of different gate materials.

In the case of the field-effect transistor arrangement according to the invention, the charge storage layer can be compartmentalized in such a way that a region of the charge storage layer that is arranged below a specific field-effect transistor of the field-effect transistor arrangement can be allocated electrical charge carriers independently of other regions of the charge storage layer.

This makes it possible, in the case of a transistor arrangement, to configure different transistors with different threshold voltages.

This is an advantage particularly in comparison with a simple contact-connection of the substrate, which does not enable threshold adjustment in such a way that different threshold voltages can be set for different transistors.

Compartmentalization is understood to mean, in particular, dividing the charge storage layer into a plurality of partial regions that are electrically decoupled or can be electrically decoupled from one another, each partial region being assigned to a field-effect transistor of the field-effect transistor arrangement. By selectively injecting a respectively predeterminable quantity of electrical charge carriers into the individual, compartmentalized partial regions, a threshold voltage can be set individually for each transistor.

Furthermore, it is possible according to the invention to increase the minimum thickness of the SOI material with a fully depleted channel region, for example at least by a factor of two.

Preferred developments of the aspect of the invention described emerge from the dependent claims.

Preferably, the charge storage layer may be an ONO layer sequence (oxide-nitride-oxide), a nanocrystal structure or an electrically conductive layer (in particular a layer made of a "floating" electrically conductive material, for example doped polysilicon or metal).

The field-effect transistor of the invention may be set up in such a way that electrical charge carriers can be introduced into the charge storage layer by means of irradiating the field-effect transistor with an electron beam, by means of Fowler-Nordheim tunneling between a source/drain region and the charge storage layer, or by means of occasionally coupling the charge storage layer to a source of electrical charge carriers via an electrically conductive terminal.

The introduction of electrical charge carriers into the charge storage layer by means of irradiating the field-effect transistor with an electron beam may be effected for example during an electron beam lithography method step, it being possible for an electron beam to be directed onto a substrate with a charge storage layer embedded therein, as a result of which electrons are permanently stored in the charge storage layer.

Furthermore, it is possible, by means of applying a suitable voltage to the terminals of the field-effect transistor, to bring about Fowler-Nordheim tunneling processes between a source/drain region and the charge storage layer, with the consequence that uncompensated electrical charge carriers remain in the charge storage layer, thereby setting the transistor properties of the field-effect transistor.

Moreover, the charge storage layer, in particular configured as an electrically conductive layer, may be coupled to an electrically conductive terminal via which the charge storage layer can be coupled to an electrical charge carrier source, in particular a voltage supply, so that electrical charge carriers can be injected into the charge storage layer via the voltage source.

Preferably, the channel region is free of a doping, i.e. the channel region is not provided with externally introduced charge carriers. This avoids undesirable effects on account of a dopant concentration fluctuation and amplifies the on current on account of the increased mobility.

The field-effect transistor may be configured as an SOI field-effect transistor ("Silicon-on-Insulator").

The adjustable electrical transistor property of the field-effect transistor is preferably the threshold voltage, but may also be the leakage current characteristic, the maximum current and/or a transistor characteristic curve.

Preferably, the charge storage layer configured as an electrically conductive layer is surrounded by an electrically insulating enveloping layer. Such an enveloping layer makes it possible for the electrically conductive layer to be electrically insulated from the surroundings, so that the electrical charge carriers are protected against flowing away from the charge storage layer. The thickness of such a layer, which is preferably configured as a silicon oxide layer, is preferably at least approximately 10 nm, thereby ensuring that a permanent threshold adjustment is made possible, preferably for a retention time of at least ten years.

The electrically conductive layer is preferably produced from polysilicon material.

The field-effect transistor arrangement according to the invention, having field-effect transistors according to the invention, is described in more detail below. Refinements of the field-effect transistor also apply to the field-effect transistor arrangement.

In the case of the field-effect transistor arrangement, preferably a common charge storage layer of all or some of the field-effect transistors is compartmentalized in such a way that the electrical transistor property of each field-effect transistor can be set independently of the rest of the field-effect transistors.

The term compartmentalization is understood here to mean, in particular, that the charge storage layer is divided into a plurality of partial regions which can clearly be allocated electrical charge carriers independently of one another. This may be realized for example by introducing the charge carriers into the charge storage layer using an electron beam, in which case, during the application of the electron beam, a partial region of a substrate may be covered with a protective layer in such a way as to prevent the electron beam from penetrating into the region of the charge storage layer located underneath.

For the case where the charge storage layer is configured as an electrically conductive layer, the compartmentalization may be realized in such a way that different regions of the electrically conductive layer are electrically decoupled or can be electrically decoupled from one another and can be allocated charge carriers separately from one another by means of external terminals.

By way of example, if an ONO layer sequence is written to using Fowler-Nordheim tunneling between a source/drain region and the charge storage layer, then the compartmentalization preferably consists in respectively selecting a specific field-effect transistor and applying to the source/drain region thereof a voltage such that a tunneling current of charge carriers is made possible locally between said source/drain region and the underlying region of the ONO layer sequence. In other words, each of the regions of the ONO layer sequence below a respective field-effect transistor of the field-effect transistor arrangement according to the invention may then be written to independently of the other field-effect transistors, since the tunneling current is in each case essentially restricted to the region of a selectable field-effect transistor in the substrate.

The method according to the invention for adjusting an electrical transistor property of a field-effect transistor is described in more detail below. Refinements of the field-effect transistor and of the field-effect transistor arrangement also apply to the method for adjusting an electrical transistor property.

In accordance with the method for adjusting an electrical transistor property of a field-effect transistor, electrical charge carriers are preferably introduced into the charge storage layer by irradiating the field-effect transistor with an electron beam, by producing Fowler-Nordheim tunneling between a source/drain region and the charge storage layer, or by coupling the charge storage layer to an electrical charge carrier source via an electrically conductive terminal.

The method according to the invention for producing a field-effect transistor is described below. Refinements of the field-effect transistor and of the field-effect transistor arrangement also apply to the method for producing a field-effect transistor.

In accordance with the production method, it is possible to form a nanocrystal structure as charge storage layer by forming a silicon oxide layer (e.g. a silicon oxide layer) in a surface region of a silicon substrate and by introducing silicon into the silicon oxide layer in such a way that a nanocrystal structure is thereby formed in the silicon oxide layer.

An ONO layer sequence as charge storage layer may be formed by forming a silicon oxide layer in a surface region of a silicon substrate, by introducing nitrogen into the silicon oxide layer in such a way that a silicon nitride layer is thereby formed in a surface region of the silicon oxide layer, and by introducing oxygen into the silicon nitride layer in such a way that a further silicon oxide layer is thereby formed in a surface region of the silicon nitride layer.

An electrically conductive layer as charge storage layer may be formed by forming a polysilicon layer preferably between two electrically insulating layers on a silicon substrate.

Furthermore, in accordance with the method described, a stripping layer may be formed in the silicon substrate below the charge storage layer by fixing a further silicon substrate to the charge storage layer, by removing the material below the stripping layer and by forming a field-effect transistor in or on a layer between stripping layer and charge storage layer.

To summarize, it can be stated that clearly the electric field in the channel region of the field-effect transistor according to the invention is modified by introducing charge carriers into a charge storage layer arranged below the channel region, which results in a characteristic influencing of the threshold voltage.

The introduction of electrical charge carriers into the charge storage layer below the channel region may be effected for example after the end of the method for producing the field-effect transistor, by means of temporarily applying an electrically conductive layer to the SOI wafer and subsequent Fowler-Nordheim tunneling. A compartmentalization may be effected for example in such a way that different regions on the wafer are provided with different values of the threshold voltage, for example differently for n-MOSFETs and p-MOSFETs. The introduction of electrical charge carriers may also be effected by means of an electron beam. The minimum thickness of electrically insulating layers, for example silicon oxide layers, by which the charge storage layer is preferably surrounded is approximately 10 nm in order that the introduced charge carriers remain in the charge storage layer for a sufficiently long time.

BRIEF DESCRIPTION OF THE DRAWINGS

Exemplary embodiments of the invention are illustrated in the figures and are explained in more detail below.

In the figures.

DETAILED DESCRIPTION OF THE PREFERRED MODE OF THE INVENTION

Figure 2:
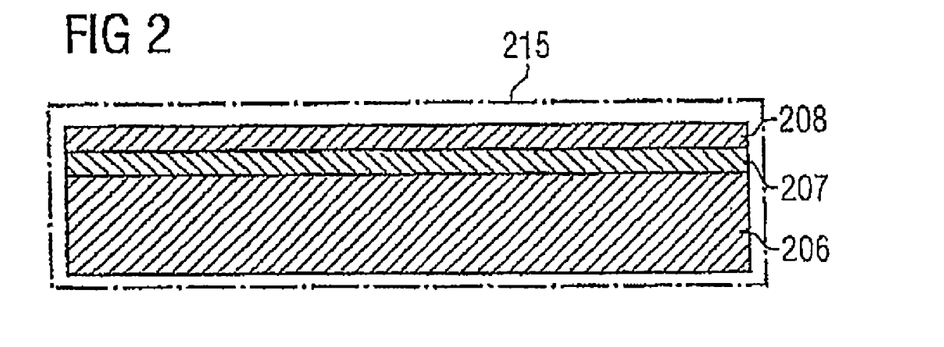
FIG. 2 shows a cross-sectional view of an auxiliary carrier substrate according to the invention, said substrate having a layer made of porous silicon and a first semiconductor partial layer.

FIG. 2 shows an auxiliary carrier substrate 215 having an auxiliary carrier layer 206 made of silicon. A layer 207 made of porous silicon is applied on the auxiliary carrier layer 206 made of silicon. A thin first semiconductor partial layer 208 made of silicon is applied on the layer 207 made of porous silicon. The thin first semiconductor partial layer 208 has a thickness in the range of 5 nm to 30 nm. The thickness of the thin first semiconductor layer 208 is preferably 20 nm.

Figure 3:
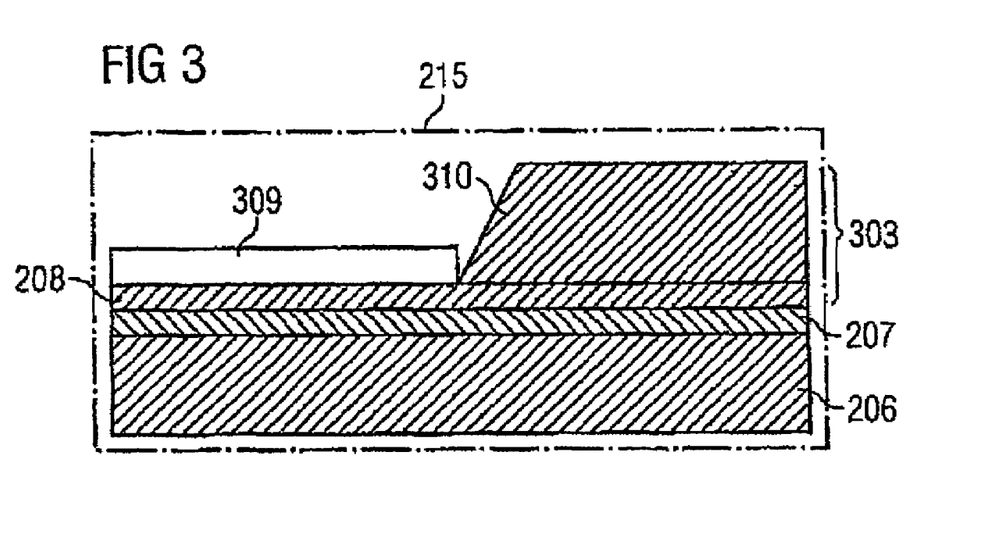
FIG. 3 shows a cross-sectional view of the auxiliary carrier substrate according to the invention after the application of a protective layer and a second semiconductor partial layer.

FIG. 3 shows the auxiliary carrier substrate 215 after further method steps, a protective layer 309 made of silicon oxide being applied on the thin first semiconductor partial layer 208. Said protective layer 309 is converted, i.e. patterned, into a masking layer by means of etching back the silicon oxide in partial regions of the auxiliary carrier substrate 215. In a further process step, after the removal of a resist layer, applied for the etching-back, in the regions of the thin first semiconductor partial layer 208 which are intended to be converted into regions of a larger thickness 305 (the uncovered regions, i.e. the regions that are not covered by the patterned masking layer), a second semiconductor partial layer 310 is formed by means of selective epitaxy. In accordance with this exemplary embodiment, the total thickness of the two semiconductor partial layers 208 and 310 together amounts to approximately 80 nm to 120 nm, preferably 100 nm. The two semiconductor partial layers 208 and 310 form the semiconductor layer 303.

Figure 4:
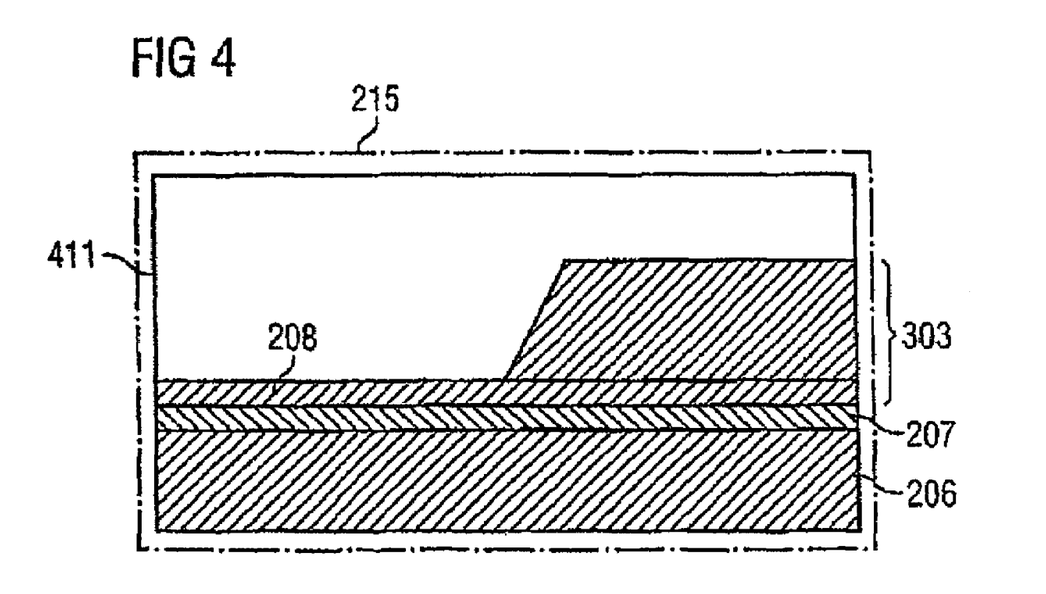
FIG. 4 shows a cross-sectional view of the auxiliary carrier substrate according to the invention after the deposition of a first insulator partial layer and subsequent planarization.

FIG. 4 shows the auxiliary carrier substrate 215 after the further process step of deposition of a first insulator partial layer 411 made of silicon oxide on the entire surface of the auxiliary carrier substrate 215. By means of the deposition on the entire surface of the auxiliary carrier substrate, the masking layer 309 becomes an integral part of the first insulator partial layer 411. A surface of the insulator partial layer 411 is polished and planarized by means of chemical mechanical polishing.

Figure 5:
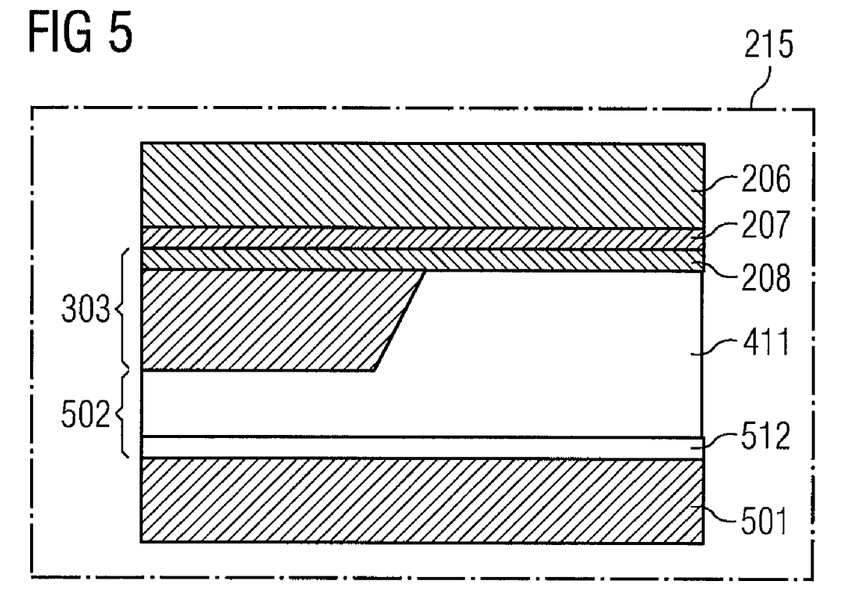
FIG. 5 shows a cross-sectional view of the substrate according to the invention, after the bonding of a carrier substrate, having a carrier layer and a second insulator partial layer, onto the auxiliary carrier substrate.

FIG. 5 shows the auxiliary carrier substrate 215 after it has been applied to a carrier substrate 501 by means of wafer bonding. For this purpose, the auxiliary carrier substrate 215 is rotated, i.e. the auxiliary carrier substrate 215 is turned 180° with respect to an axis located perpendicular to the plane of the paper in FIG. 4, and placed and bound by its planarized surface of the first insulator partial layer 411 onto the carrier substrate 501, on which a second insulator partial layer 512 is formed. By virtue of the bonding, an integral insulator layer 502 is produced from the first insulator partial layer 411 and the second insulator partial layer 512.

A possible method of wafer bonding is direct adhesive wafer bonding, for example; in the case of this method, the actual silicon wafer is applied and adhesively bonded onto an auxiliary wafer. A further method of wafer bonding is anodic (electrostatic) bonding, for example, in which the two substrates with which the bonding is to be carried out are brought together and brought to a high temperature, while a strong electric field is applied across a connecting layer between the two substrates. A strong bond is thereby formed between the two substrates.

Figure 6:
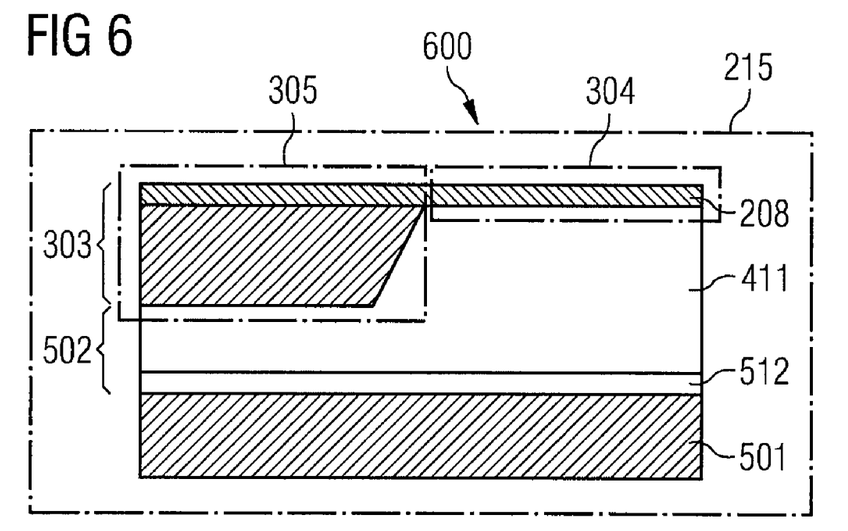
FIG. 6 shows a cross-sectional view of the substrate according to the invention after the removal of the auxiliary carrier substrate.

FIG. 6 shows a substrate 600 after the auxiliary carrier layer 206 has been removed. According to the invention, this is done by etching the porous silicon layer 207 by means of a water jet. As a result of this, the auxiliary carrier layer 206 is removed and the layer sequence of the substrate 600 is finished.

The substrate 600 is subsequently subjected to heat treatment using $H_2$. Regions that are fully depleted of electrical charge carriers are formed from the regions of the semiconductor layer 303 having a small thickness 304 by means of diffusion doping or ion implantation of elements of the third or fifth main group, e.g. boron, phosphorus or arsenic, and regions that are partially depleted of charge carriers are formed from the regions of the semiconductor layer 303 having a large thickness 305 by means of diffusion doping or ion implantation of elements of the third or fifth main group, e.g. boron, phosphorus or arsenic.

To summarize, the invention creates an FD-PD-SOI mixed substrate having a planar surface of the silicon layer, which planar surface simplifies a further processing.

A description is given below, with reference to FIG. 7, of a field-effect transistor 700 in accordance with one aspect of the invention.

Figure 7:
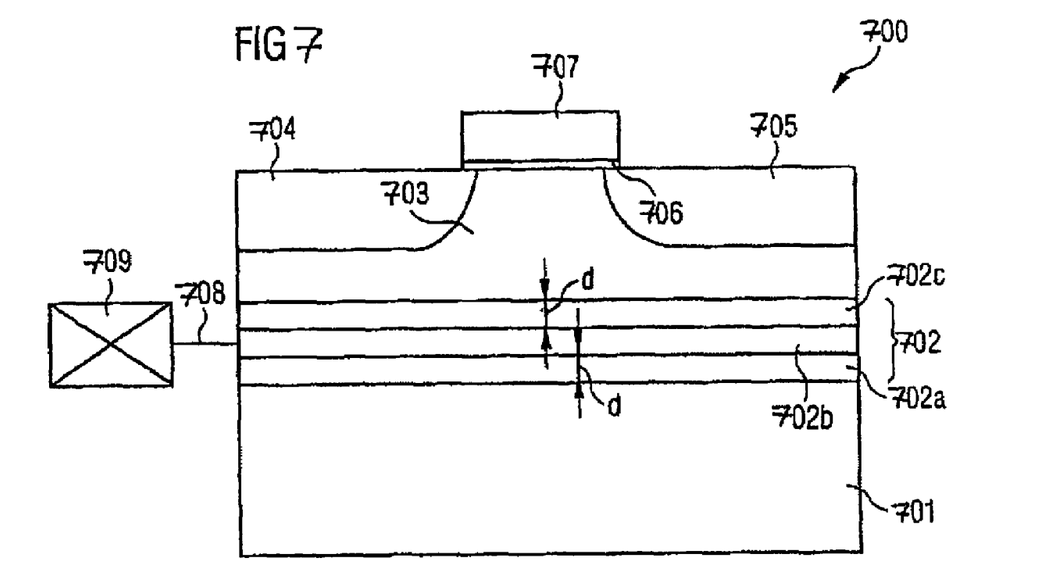
FIG. 7 shows a field-effect transistor in accordance with one aspect of the invention.

The field-effect transistor 700 shown in FIG. 7 has a silicon substrate 701 and a charge storage layer sequence 702. The charge storage layer sequence 702 is constructed from an electrically insulating first silicon oxide layer 702a, an electrically conductive polysilicon layer 702b on the first silicon oxide layer 702a and from an electrically insulating second silicon oxide layer 702c on the polysilicon layer 702b. An undoped channel region 703 is formed above the charge storage layer sequence 702. Furthermore, the field-effect transistor 700 has a first $n^+$-doped source/drain region 704 and a second $n^+$-doped source/drain region 705. A gate-insulating layer 706 made of silicon oxide is arranged above the channel region 703 between the two source/drain regions 704, 705. A gate region 707 is arranged on the gate-insulating layer 706. Furthermore, the polysilicon layer 702b is optionally coupled to a controllable voltage source 709 via a terminal 708.

In order to set the threshold voltage of the field-effect transistor 700, charge carriers are injected into the polysilicon layer 702b via the controllable voltage source 709 and the terminal 708, which charge carriers are protected from flowing away into the surroundings on account of the polysilicon layer 702b being encapsulated on both sides with electrically insulating layers 702a, 702c. Since the thickness d of the electrically insulating layers 702a, 702c, with a value of 10 nm, is chosen to be sufficiently thick, the charge carriers in the polysilicon layer 702b are sufficiently reliably protected against flowing away, so that the charge carriers are permanently stored in the polysilicon layer 702b for a sufficiently long retention time of ten years, for example. After the programming of the charge storage layer sequence 702, the controllable voltage source 709 is electrically decoupled from the field-effect transistor 700. On account of the electrons permanently stored in the polysilicon layer 702b, the electrical conductivity or the electric field distribution within the channel region 703 is characteristically modified, so that a desired threshold voltage is set.

A description is given below, with reference to FIG. 8A to FIG. 8H, of a method for producing a field-effect transistor in accordance with one aspect of the invention.

Figure 8A:
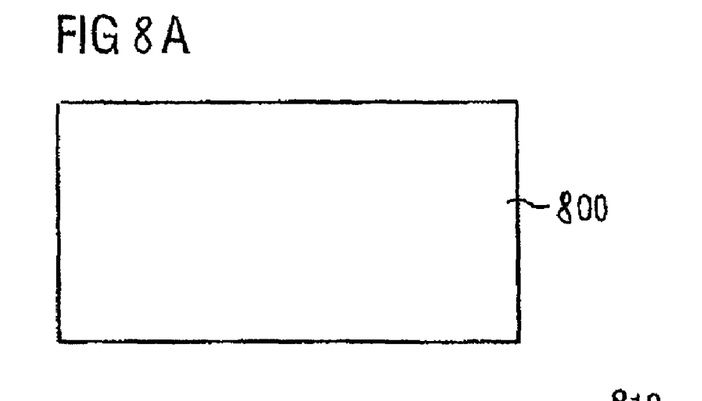
FIGS. 8A to 8H show layer sequences at different points in time during a method for producing a field-effect transistor in accordance with one aspect of the invention.

The silicon wafer 800 made of monocrystalline silicon shown in FIG. 8A is used as the starting material.

Figure 8B:
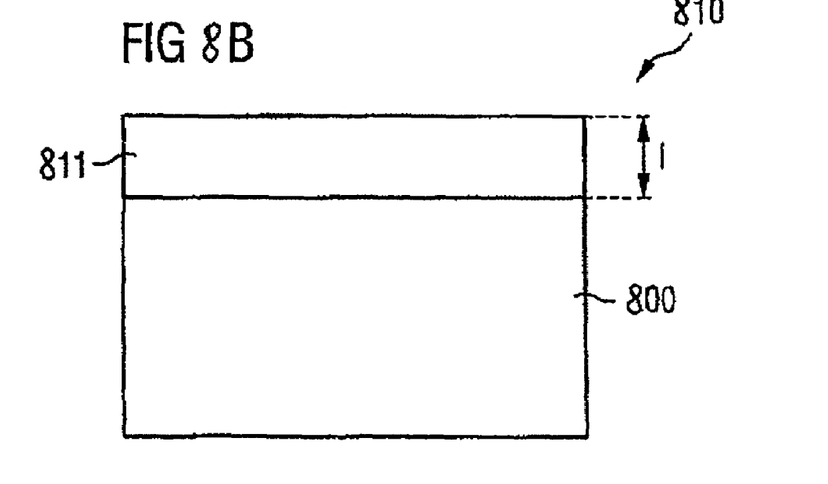

In order to obtain the layer sequence 810 shown in. FIG. 8B, the upper surface of the silicon wafer 800 in accordance with FIG. 8B is thermally oxidized, thereby forming a first silicon oxide layer 811 (the rear-side oxidation is not shown in the figure). In accordance with the exemplary embodiment described, the silicon wafer 800 is oxidized in such a way that the thickness of the first silicon oxide layer 811 is approximately 30 nm.

Figure 8C:
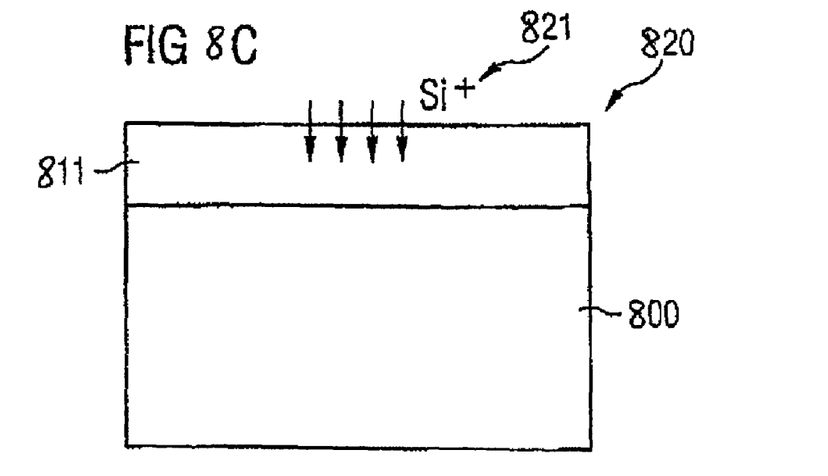

In order to obtain the layer sequence 820 shown in FIG. 8C, silicon material is implanted in the first silicon oxide layer 811 using a suitable ion implantation method. The silicon material is used in further method steps for forming a layer made of nanocrystalline silicon structures in the first silicon oxide layer 811. As an alternative to the $Si^+$ ions 821 shown in FIG. 8C, it is possible, for example, to introduce germanium ions ($Ge^+$) into the first silicon oxide layer 811.

The effective ion implantation dose of silicon or germanium in the first silicon dioxide layer 811 is of the order of magnitude of $10^{15} cm^{-2}$, for example.

Figure 8D:
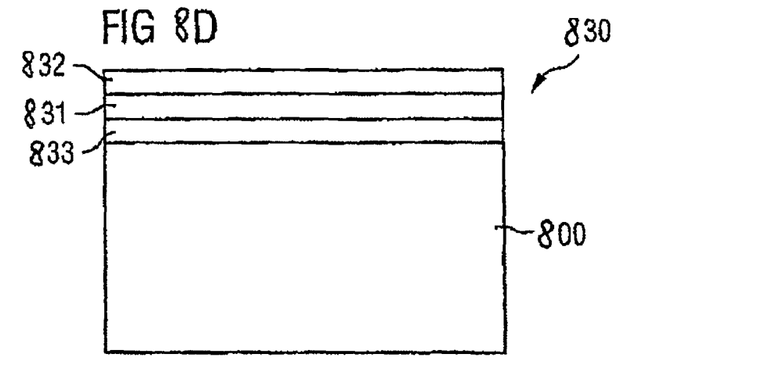

In order to obtain the layer sequence 830 shown in FIG. 8D, the layer sequence 820 shown in FIG. 8C is subjected to an annealing method in order to generate nanocrystals from the silicon ions 821 in the first silicon oxide layer 811. This results in a silicon nanocrystal layer 831 between a first silicon oxide partial layer 832 and a second silicon oxide partial layer 833.

The linear dimensions of the nanocrystalline silicon or germanium structures are between approximately 1 nm and approximately 10 nm. The distance between adjacent nanocrystals is preferably at least 5 nm.

Figure 8E:
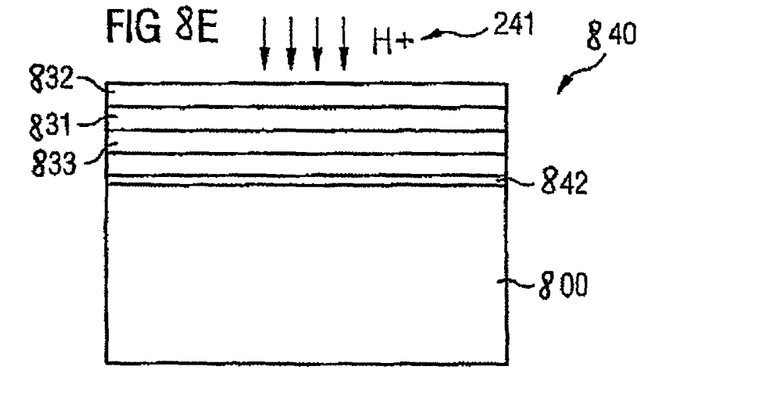

In order to obtain the layer sequence 840 shown in FIG. 8E, hydrogen ions H⁺ 841 (it is also optionally possible to use boron ions, for example) are introduced into the silicon substrate 800 below the second silicon oxide partial layer 833, thereby forming a stripping layer 842. The stripping layer is silicon material in which hydrogen ions 841 are accumulated, so that this layer is mechanically destabilized. The region between the stripping layer 842 and the second silicon oxide partial layer 833 may likewise contain a certain quantity of hydrogen ions, but fewer than a critical concentration which has to be exceeded for stripping.

Figure 8F:
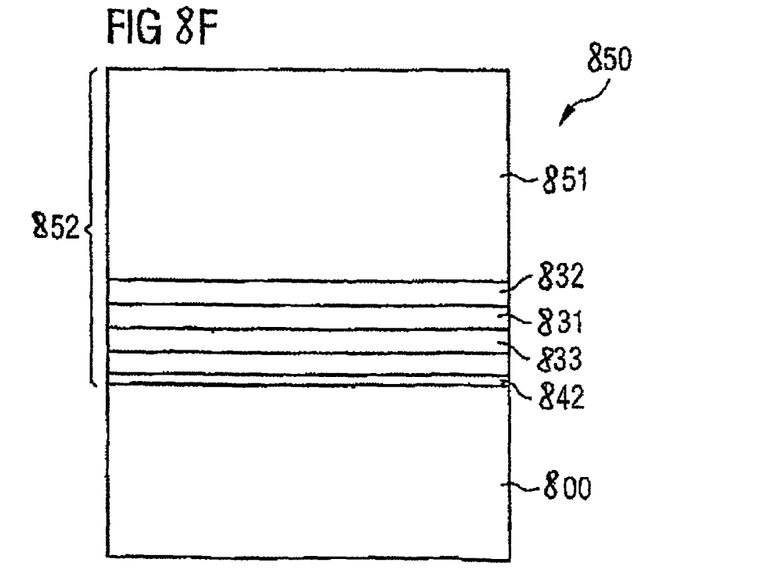

In order to obtain the layer sequence 850 shown in FIG. 8F, another silicon wafer 851 is fixed to the layer sequence 840 using a wafer bonding method in such a way that an underside of the other silicon wafer 851 adjoins the first silicon oxide partial layer 832 and is fixed to the latter. This creates a layer sequence 850 constructed from a useful layer sequence 852 and a partial region of the silicon substrate 800, which are separated from one another by the stripping layer 842.

Figure 8G:
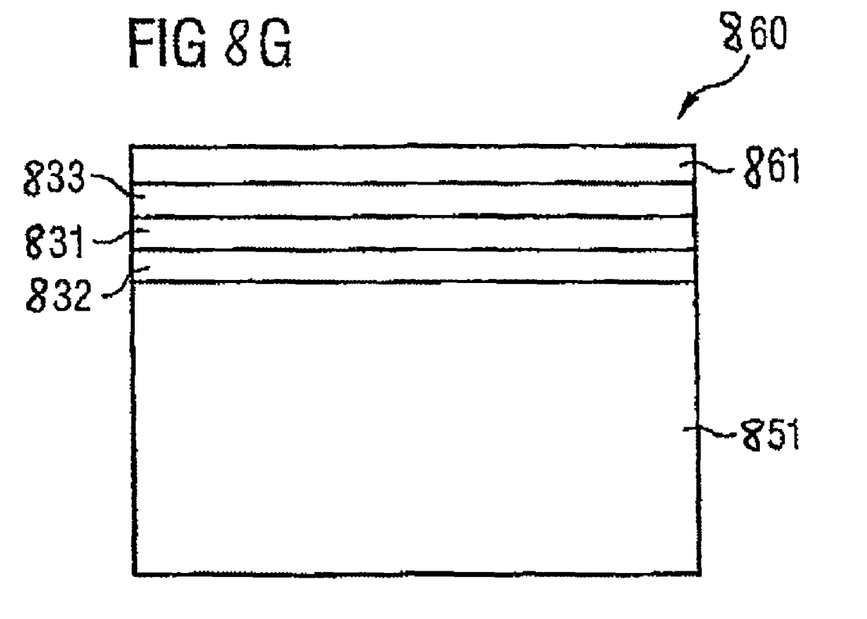

In order to obtain the layer sequence 860 shown in FIG. 8G, the useful layer sequence 852 is stripped from the layer sequence 850 at the mechanically destabilized stripping layer 842. The layer sequence 860 exhibits the useful layer sequence 852 turned through 180° after stripping. In particular, a thin-film silicon region 861 is created in a surface region of the layer sequence 860, which represents the crystalline starting material for a subsequent CMOS processing.

Figure 8H:
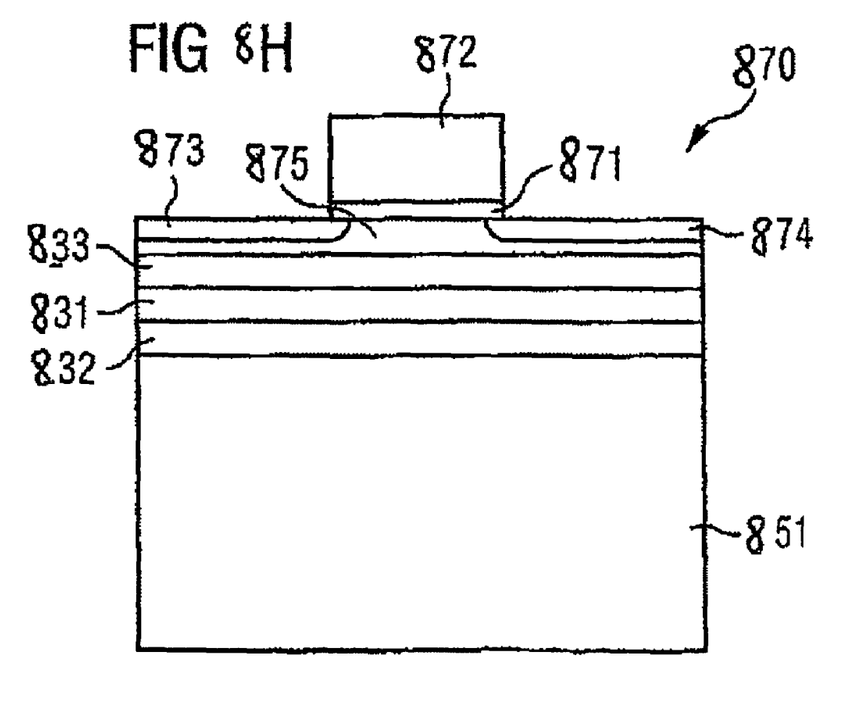

In order to obtain the field-effect transistor 870 shown in FIG. 8H, firstly a further silicon oxide layer is grown thermally and a polysilicon layer is deposited on the surface of the layer sequence 860. These two layers are patterned in such a way that a gate-insulating layer 871 and a gate region 872 remain as a result. A first n⁺-doped source/drain region 873 and a second n⁺-doped source/drain region 874 are formed using a suitable implantation method. A channel region 875 remains between the source/drain regions 873, 874. This creates the field-effect transistor 870 with adjustable transistor properties shown in FIG. 8H.

A description is given below, with reference to FIG. 9A, FIG. 9B, of a method for producing a field-effect transistor in accordance with another aspect of the invention.

Figure 9A:
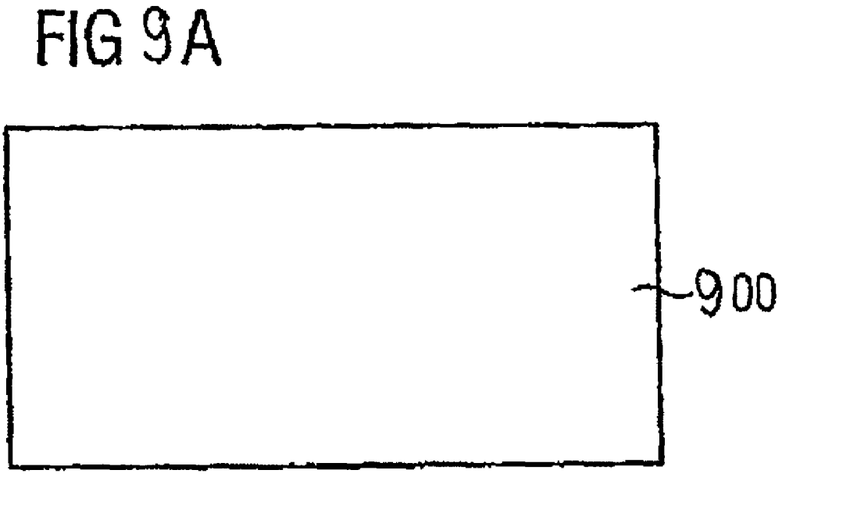
FIGS. 9A and 9B show layer sequences at different points in time during a method for producing a field-effect transistor in accordance with another aspect of the invention.

The starting material is once again a silicon wafer 900 as shown in FIG. 9A.

Figure 9B:
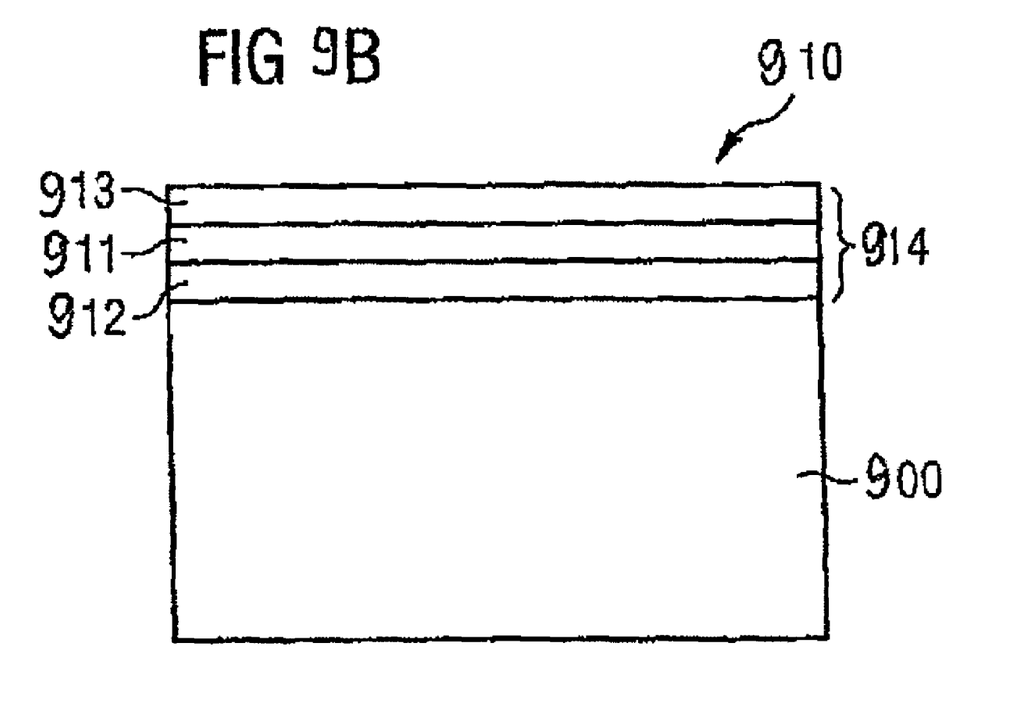

In order to obtain the layer sequence 910 shown in FIG. 9B, the upper surface region of the silicon wafer 900 in accordance with FIG. 9A is thermally oxidized and a silicon oxide layer is thereby formed. A silicon nitride layer 911 is formed above a first silicon oxide partial layer 912 by means of nitriding. A second silicon oxide partial layer 913 is formed by means of thermal oxidation of the layer sequence obtained. This creates an ONO layer sequence 914 at a surface region of the layer sequence 910, which can be used as charge storage layer.

The layer sequence 910 shown in FIG. 9B is functionally similar to the layer sequence 830 shown in FIG. 8D. Therefore, the further method steps for forming a field-effect transistor proceeding from the layer sequence 910 may be effected in an analogous manner to that described with reference to FIG. 8E to FIG. 8H. The difference between a field-effect transistor formed in this way and the field-effect transistor 870 shown in FIG. 8H is that an ONO layer sequence is used as charge storage layer in the case of the field-effect transistor produced in a manner proceeding from the layer sequence 910, whereas a polysilicon layer 831, embedded between two silicon oxide partial layers 832, 833, is used in the case of the field-effect transistor 870.

What is claimed is:

1. A method for producing a substrate, comprising:
applying a semiconductor layer, the semiconductor layer having a region of thicker thickness and a region of thinner thickness, wherein the semiconductor layer is formed at least partly by means of selective epitaxy, wherein the step of applying the semiconductor layer comprises:
forming a thin first semiconductor partial layer on an auxiliary carrier layer;
depositing a masking layer made of an insulator material on at least one region of the thin first semiconductor partial layer; and
forming a second semiconductor partial layer on any regions of the thin first semiconductor partial layer which are not covered by the masking layer;
applying an insulator layer on the semiconductor layer, the insulator layer having a region of thicker thickness and a region of thinner thickness,
wherein the insulator layer is applied such that the region of thinner thickness of the insulator layer contacts the region of thicker thickness of the semiconductor layer, and the region of thicker thickness of the insulator layer contacts the region of thinner thickness of the semiconductor layer, such that the surface of the semiconductor layer facing away from the insulator layer is planar, and
wherein the step of applying the insulator layer comprises:
depositing a first insulator partial layer on an entire surface of the substrate; and
planarizing the first insulator partial layer;
applying a carrier layer to the insulator layer, wherein the step of applying the carrier layer comprises the steps of:
providing a carrier substrate;
applying a second insulator partial layer on the carrier substrate; and
bonding the carrier substrate and the second insulator partial layer to the planarized surface of the first insulator partial layer such that the second insulator partial layer is arranged on the first insulator partial layer, and
removing the auxiliary carrier layer.

2. The method as claimed in claim 1, wherein the planarization of the first insulator partial layer is performed by chemical mechanical polishing.

3. The method as claimed in claim 1, further comprising producing a layer made of porous silicon on the auxiliary carrier layer, before the step of forming the thin first semiconductor partial layer.

4. The method as claimed in claim 3, wherein the step of removing the auxiliary carrier layer by etching comprises the step of removing the porous silicon by means of a water jet.

5. The method as claimed in claim 1, further comprising performing an H₂ heat treatment of the substrate after the step of removing the auxiliary carrier layer.

6. The method as claimed in claim 1, wherein the carrier layer, the auxiliary carrier layer, the thin first semiconductor partial layer, and the second semiconductor partial layer essentially comprise silicon.

7. The method as claimed in claim 1, wherein the first insulator layer and the second insulator layer essentially comprise silicon oxide.

8. The method as claimed in claim 1, wherein the thin first semiconductor partial layer and/or the second semiconductor partial layer are formed by epitaxy and/or selective epitaxy.

* * * * *

UNITED STATES PATENT AND TRADEMARK OFFICE
CERTIFICATE OF CORRECTION

PATENT NO.         : 7,611,928 B2                                              Page 1 of 1
APPLICATION NO.    : 10/968846
DATED              : November 3, 2009
INVENTOR(S)        : Franz Hofmann et al.

It is certified that error appears in the above-identified patent and that said Letters Patent is hereby corrected as shown below:

On the title page, item [56] at page 2, in Other Publications, line 8, delete "unibont" and insert -- unibond -- therefor.

At column 1, line 44, delete "H I" and insert -- HI, -- therefor.

Signed and Sealed this

Twenty-third Day of March, 2010

David J. Kappos
*Director of the United States Patent and Trademark Office*